US006236238B1

(12) United States Patent
Tanji et al.

(10) Patent No.: US 6,236,238 B1
(45) Date of Patent: May 22, 2001

(54) OUTPUT BUFFER WITH INDEPENDENTLY CONTROLLABLE CURRENT MIRROR LEGS

(75) Inventors: Todd M. Tanji, Eagan; Robert S. Wentink, Falcon Heights; Jim R. Welch, Maple Grove, all of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/311,242

(22) Filed: May 13, 1999

(51) Int. Cl.$^7$ .............................. H03K 19/0175

(52) U.S. Cl. .................. 326/83; 326/82; 326/86

(58) Field of Search .................. 326/86, 83, 33, 326/81, 82; 327/53, 108

(56) References Cited

U.S. PATENT DOCUMENTS

| | | | |
|---|---|---|---|
| 3,643,183 | 2/1972 | Geffe | 333/80 R |
| 3,715,693 | 2/1973 | Fletcher et al. | 333/80 T |
| 3,758,885 | 9/1973 | Voorman et al. | 333/80 T |
| 4,264,874 | 4/1981 | Young | 330/277 |
| 4,529,947 | 7/1985 | Biard et al. | 330/259 |
| 4,812,785 | 3/1989 | Pauker | 331/117 FE |
| 5,392,003 | 2/1995 | Nag et al. | 330/254 |
| 5,430,409 | 7/1995 | Buck et al. | 330/2 |
| 5,451,898 | 9/1995 | Johnson | 327/563 |
| 5,565,815 | 10/1996 | Klein | 330/253 |
| 5,642,071 | 6/1997 | Sevenhans et al. | 327/359 |
| 5,726,603 | 3/1998 | Chawla et al. | 330/269 |
| 5,767,664 | 6/1998 | Price | 323/987 |
| 5,809,013 | 9/1998 | Kachman | 370/253 |
| 5,847,623 | 12/1998 | Hadjichristos | 332/105 |
| 5,854,973 | 12/1998 | Holtvoeth | 455/245 |
| 5,894,236 | * 7/1999 | Mizoguchi El Al | 327/108 |
| 5,920,204 | * 7/1999 | Bruno | 226/86 |
| 5,966,030 | * 10/1999 | Schmitt | 326/86 |
| 6,037,811 | * 3/2000 | Ozguc | 327/108 |

FOREIGN PATENT DOCUMENTS

| | | |
|---|---|---|
| 0575676 | 12/1993 | (EP) . |
| 0874453 | 10/1998 | (EP) . |
| 9945656 | 9/1999 | (WO) . |

OTHER PUBLICATIONS

Rofougaran et al., "A 900 MHz CMOS RF Power Amplifier with Programmable Output Power", Proceedings VLSI Circuits Symposium, Honolulu, Jun. 1994, pp. 133–134.
Rofougaran et al., "A 1 GHz CMOS RF Front–End IC for a Direct–Conversion Wireless Receiver", IEEE Journal of Solid–State Circuits, vol. 31, Jul. 1996, pp. 880–889.
Image–Rejection in Mixers, copyright AAA, 1996.
Wilson et al., "A Single–Chip VHF and UHF Receiver for Radio Paging", *IEEE Journal of Solid State Circuits*, vol. 26, No. 12, Dec. 1991, pp. 1945–1950.
Crols et al., "CMOS Wireless Transceiver Design", Kluwer Academic Publishers, 1997, pp. 17–23.
Chang et al., "A CMOS Channel–Select Filter for a Direct–Conversion Wireless Receiver", to appear in *IEEE Journal of Solid–State Circuits*, Apr. 1997.

(List continued on next page.)

Primary Examiner—David Nelms
Assistant Examiner—David Lam
(74) Attorney, Agent, or Firm—John G. Shudy, Jr.

(57) ABSTRACT

A programmable output buffer with independently controllable current mirror legs is disclosed. The output buffer includes a current mirror that has a reference leg and a number of current mirror legs. The reference leg is biased using a reference current that is relatively independent of the supply voltage. Each of the current mirror legs is coupled to the output terminal of the output buffer, and conducts a current that is proportional to the reference current. This produces an output current that is relatively independent of variations in the supply voltage. To provide a programmable output power level, each of the current mirror legs are separately enabled. By controlling which of the current mirror legs are enabled, the output power of the output buffer can be controlled.

29 Claims, 7 Drawing Sheets

OTHER PUBLICATIONS

Behzad Razavi, "Design Considerations for Direct–Conversion Receivers", *IEEE Transactions on Circuits and Systems—II: Analog and Digital Signal Processing*, vol. 44, No. 6, Jun. 1997, pp. 428–435.

Thomas H. Lee, "The Design of COMS Radio–Frequency Integrated Circuits", Cambridge University Press, 1998, pp. 344–351.

Product Specification for Advanced Pager Receiver UAA2082, Integrated Circuits, Jan. 16, 1996.

Moulding et al., "Gyrator Video Filter IC with Automatic Tuning", *IEEE Journal of Solid–State Circuits*, vol. SC15, No. 6, Dec. 1980, pp. 963–968.

\* cited by examiner

OUTPUT BUFFER WITH INDEPENDENTLY CONTROLLABLE CURRENT MIRROR LEGS

CROSS REFERENCE TO CO-PENDING APPLICATIONS

The present application is related to U.S. patent application Ser. No. 09/311,234, filed May 13, 1999, entitled, "Compensation Mechanism For Compensating Bias Levels Of An Operation Circuit In Response To Supply Voltage Changes", U.S. patent application Ser. No. 09/311,105, filed May 13, 1999, entitled, "Differential Filter with Gyrator", U.S. patent application Ser. No. 09/311,246, filed May 13, 1999, entitled, "Filter with Controlled Offsets For Active Filter Selectivity and DC Offset Control", U.S. patent application Ser. No. 09/311,029, filed May 13, 1999, entitled, "State Validation Using Bi-Directional Wireless Link", U.S. patent application Ser. No. 09/311,250, filed May 13, 1999, entitled, "Wireless System With Variable Learned-In Transmit Power", and U.S. patent application Ser. No. 09/311,014, filed May 13, 1999, entitled, "Wireless Control Network With Scheduled Time Slots", all of which are assigned to the assignee of the present invention and incorporated herein by reference.

BACKGROUND OF THE INVENTION

This invention relates to buffers, and more particularly, to output buffers that provide a stable output current and a programmable output power level. The term output buffer, as used herein, refers to all circuits that buffer electrical signals including amplifying and non-amplifying circuits or devices.

The use of output buffers to amplify or otherwise buffer electrical signals is well known in the art. Typical output buffers are implemented using bipolar transistors, complementary metal-on-semiconductor (CMOS) transistors, or a combination of each (Bi-CMOS). Most output buffers have an output stage that provides the output power to the output signal. For CMOS technologies, the output stage typically includes a p-type pull-up metal-on-semiconductor (PMOS) transistor coupled in series with an n-type pull-down MOS (NMOS) transistor. The NMOS transistor is coupled to VSS and the PMOS transistor is coupled to VDD. The output signal is typically taken at the interconnection between the PMOS and NMOS transistors.

The size of each of the output transistors helps determine the drive capability of the output stage. Typically, the output transistors are sized to accommodate an expected load, such as "N" unit loads where "N" is an integer greater than zero. Thus, the drive capability of a typical output buffer is optimized for a particular load size. When an output buffer drives a load that is larger than the expected load size, the output transistors tend to conduct insufficient current to meet the output voltage slew rate requirements, making the output buffer impermissibly slow. When the output buffer drives a load that is less than the expected load size, the output transistors tend to conduct excessive current, which reduces the output voltage slew rate, but increases the transient noise on adjacent signal and power lines. These problems are exacerbated when several output buffers are switched at the same time, such as when a bus is switched from a value of FF to 00 or the like.

To help alleviate some of these problems, U.S. Pat. No. 5,632,019 to Masiewicz suggests providing an output buffer that has programmable source/sink characteristics that can be matched to a particular capacitive load. The output buffer of Masiewicz includes a number of unit buffers that are individually enabled by a programmable control block. By enabling only those unit buffers that are necessary to drive a particular load capacitance, the source/sink characteristics of the output buffer may be matched to the particular load size.

A limitation of Masiewicz is that each of the unit buffers include a pull-up transistor and a pull-down transistor coupled in series between VDD and VSS. In this configuration, the source/sink characteristics of each unit buffer are dependent on the supply voltage. This is particularly problematic when the supply voltage is provided by a battery or the like. A limitation of many batteries, especially alkaline batteries, is that the supply voltage tends to degrade over time. Therefore, if a battery is used, the source/sink characteristics of Masiewicz will tend to degrade over time. Even when the supply voltage is not provided by a battery, the source/sink characteristics of Masiewicz may change with variations in the supply voltage.

Another limitation of Masiewicz is that no Electro-Static-Discharge (ESD) protection is provided. ESD is an increasingly significant problem in integrated circuit design. Potentially destructive electrostatic pulses, which are known as ESD events, are often due to various transient sources such as human or machine handling of the integrated circuit chip during processing, assembly and installation. Most ESD events originate at one of the integrated circuit pads. Since output buffers are typically connected to an integrated circuit pad, it would be desirable to provide some sort of ESD protection to the output buffer circuitry.

For a CMOS output buffer, a typical ESD event includes a high voltage pulse to the output pad, resulting in a high discharge current path through one of the PMOS or NMOS transistors to $V_{dd}$ or $V_{ss}$, respectively. For the NMOS transistor, and depending upon the polarity of the ESD voltage pulse supplied to the pad, the discharge path may proceed either via an avalanche breakdown of the drain/channel junction or via the forward biasing of the drain/channel diode. The avalanche breakdown type of discharge path is the most destructive, since it is most likely to result in irreversible damage to the structure of the NMOS transistor. A similar discharge path may exist through the PMOS transistor.

One approach for providing ESD protection to the PMOS and NMOS transistors of an output buffer is disclosed in U.S. Pat. No. 4,990,802 to Smooha. Smooha discloses placing a resistor between the integrated circuit pad and the buffer circuit. This resistor reduces the current that can pass through the output transistors during an ESD event. This helps reduce the electrical stress in the output buffer transistors. A limitation of this approach is that the source/sink current of the output buffer is also reduced. For an output buffer that is required to drive a relatively high current load through the output pad, placing such a resistor in series with the output pad may produce an unacceptable output voltage slew rate. Therefore, many applications, including those requiring fast response times, may not be compatible with such an approach.

One application where fast response times are often required is in RF communications. The use of power amplifiers and other circuits for transmitting RF signals is well known in the art. Power amplifiers have been used in radio transmitters, television transmitters, CB radios, microwave links, satellite communications systems, local RF networks, and other wireless communication applications. Power amplifiers typically include an output buffer stage for driving the RF signal to an antenna or the like.

In some RF applications, the output buffer is connected to a harmonic filter such as a parallel LC resonant tank or the like. One advantage of using a parallel LC resonant tank is that the tank can be tuned to a desired RF carrier frequency to allow desired frequencies to pass while attenuating spurious emissions. Another advantage of using a parallel LC resonant tank, in conjunction with an RF choke to VDD, is that the peak amplitude of the output signal can be increased to about twice the supply voltage. This helps increase the strength of the RF signal at the antenna. Other tank configurations may provide similar results.

For many applications, such as low power applications, the increased output voltage swing caused by the tank may damage the output buffer circuiting. In a typical low power application, the supply voltage is reduced from, for example, 5.0V to 3.0V. While this helps reduce the power consumed by the device, it also tends to reduce the performance of the device. To help regain some of the performance, a special low voltage manufacturing process may be used when fabricating the device. In a low voltage process, such as a 3.0V process, the gate oxide may be made thinner than in a conventional 5.0V process. This tends to increase the speed and sensitivity of the active devices. Other process parameters may also be optimized for increased performance of the device.

A limitation of using a low voltage process is that the resulting devices may be more sensitive to voltage, and may become damaged when exposed to higher voltages. For example, five volts can damage the gate oxide of some low voltage devices, rendering the devices inoperative. For these reasons, an output stage that is manufactured using a low voltage process may not be compatible with the use of a parallel LC resonant tank. As indicated above, a parallel LC resonant tank may increase the voltage swing on the output terminal of the device. This increased voltage swing may damage the gate oxide or other layer in the low voltage device.

SUMMARY OF THE INVENTION

The present invention overcomes many of the disadvantages of the prior art by providing an output buffer that conducts an output current that is relatively independent of variations in the supply voltage. This is accomplished by configuring the output buffer as a current mirror, rather than a traditional pull-up/pull-down pair of CMOS transistors. The current mirror preferably has a reference leg and a number of current mirror legs. The reference leg is biased using a reference current that is relatively independent of the supply voltage. Each of the current mirror legs is coupled to the output terminal of the output buffer, and conducts a current that is proportional to the reference current. This produces an output current that is relatively independent of variations in the supply voltage. To provide a programmable output power level, each of the current mirror legs may be separately enabled. By controlling which of the current mirror legs are enabled, the output power of the output buffer can be controlled.

For some applications such as low power RF communications, it may be desirable to increase the voltage level that the output terminal of the output buffer can tolerate. This may be particularly useful when a tank or the like is used in conjunction with a low voltage output buffer. As indicated above, the tank can cause the output voltage of an output buffer to peak at about twice the supply voltage. To increase the voltage level that the output buffer can tolerate, some or all of the transistors may be higher voltage devices. In a preferred embodiment, a cascode transistor is inserted between each of the current mirror legs and the output terminal. The cascode transistor can preferably tolerate more voltage than the low voltage transistors in each current mirror leg. In one embodiment, the cascode transistor has a thicker gate oxide than the other low voltage transistors. Alternatively, or in addition to, other parameters such as spacing, thickness, doping, etc. of selected layers of the cascode transistor may be altered to increase the voltage tolerance of the cascode transistor.

To increase the ESD protection of the output buffer, a resistor may be provided in each of the current mirror legs. Each of the resistors reduce the current that can pass through the corresponding current mirror leg during an ESD event. Since the resistors are placed in each parallel current mirror leg, the effective resistance of the output path is minimized. This improves the ESD level of the output buffer while maintaining an acceptable performance level.

BRIEF DESCRIPTION OF THE DRAWINGS

Other objects of the present invention and many of the attendant advantages of the present invention will be readily appreciated as the same becomes better understood by preference to the following detailed description when considered in connection with the accompanying drawings, in which like reference numerals designate like parts throughout the figures thereof and wherein.

DETAILED DESCRIPTION OF THE PREFERRED EMBODIMENTS

The present invention is an output buffer that provides an output current that is relatively independent of variations in the supply voltage. This helps maintain a desired signal-to-noise ratio, a dynamic range and/or other parameter when the supply voltage degrades or otherwise varies over time. The present invention also provides an output buffer that has a programmable output power level. This is useful in many applications, including both digital and analog applications. One preferred application is a low power RF application, as shown and described in more detail below.

Figure 1:
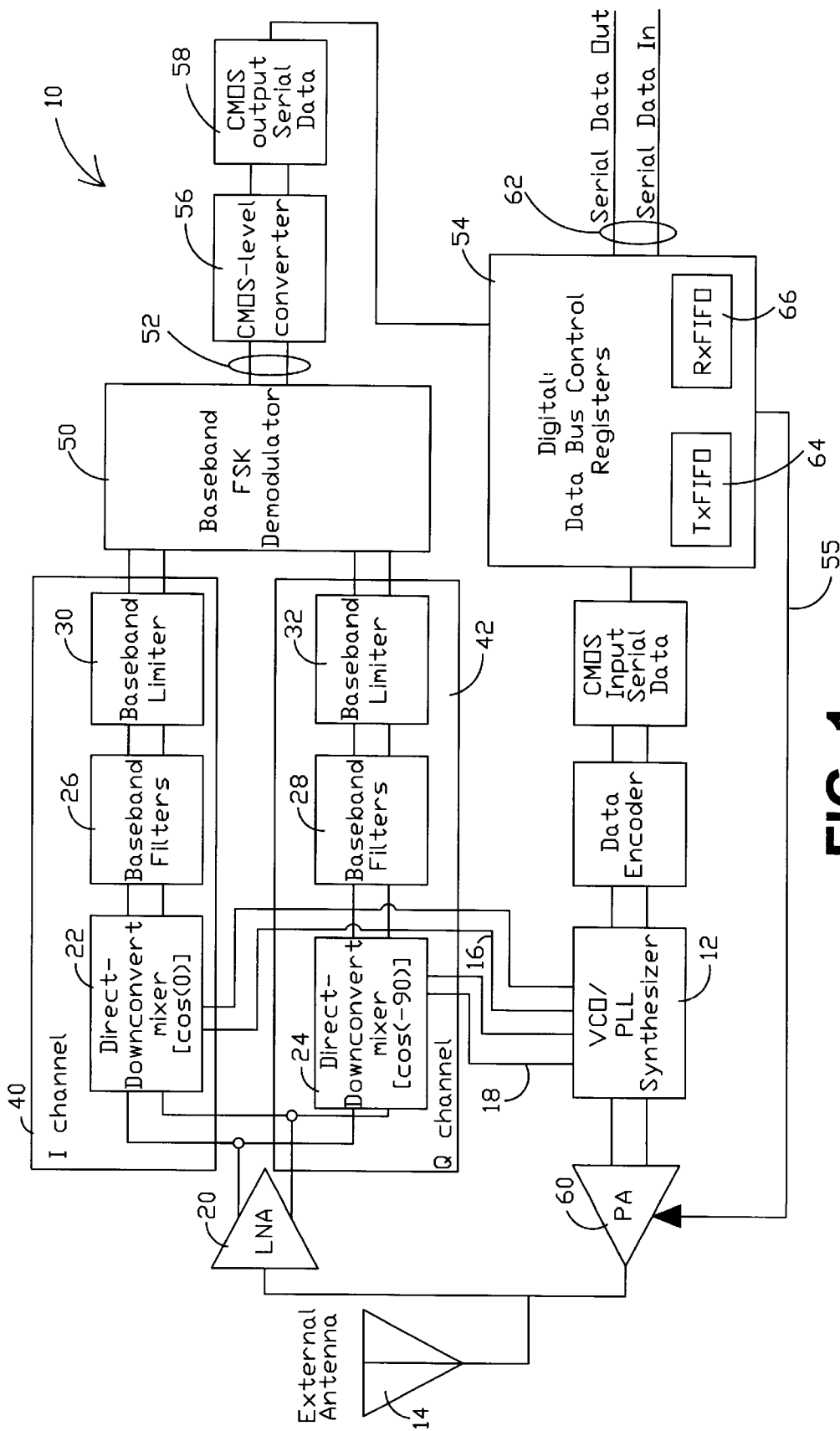
FIG. 1 is a block diagram of an integrated Direct Down Conversion Narrowband FSK Transceiver incorporating the present invention.

FIG. 1 is a block diagram of an integrated direct down conversion Narrowband FSK Transceiver 10 that incorporates an output buffer of the present invention. The Narrowband FSK Transceiver 10 includes both transmit and receive functions, preferably on a single substrate with minimal use of external components. In use, the Narrowband FSK Transceiver 10 provides a half-duplex transceiver radio data link capable of statistical frequency-spread transmissions.

Two or more Narrowband Transceivers 10 can be used to form a wireless data communication network. Because each Narrowband FSK Transceiver 10 includes both transmit and receive functions, bi-directional transmission is possible. Bi-directional transmission allows data transfers to be confirmed, thereby increasing the reliability of the link to near 100 percent, depending on the access control algorithm implemented by the user.

The basic architecture of the Narrowband FSK Transceiver 10 is shown in FIG. 1. Off-chip components may include a crystal (which can be shared with an applications microprocessor), front end LC matching and filtering components, LC circuits for tuning the Phase Lock Loop (PLL)/Voltage Controlled Oscillator (VCO) 12, some external capacitors for filtering supply noise, a printed circuit board (PCB), an antenna 14 and a power source. The single chip Narrowband FSK Transceiver 10 is intended for the 418 MHz, 434.92 MHz, 868–870 MHz, and 902–928 MHz frequency bands.

The receiver design is based on the direct down conversion principle, which mixes the input signal directly down to the baseband using a local oscillator at the carrier frequency. The direct down conversion principle is discussed in "Design Considerations for Direct-Conversion Receivers", by Behzad Rasavi, *IEEE Transactions On Circuits and Systems—II; Analog and Digital Signal Processing*, Vol. 44, No. 6, June 1997. In a direct down conversion algorithm, two complete signal paths are provided including an I-channel 40 and a Q-channel 42, where the Q-channel 42 is shifted 90 degrees relative to the I-channel 40. The I-channel 40 and the Q-channel 42 are used to demodulate the received signal.

The received signal is first provided to a low noise amplifier (LNA) 20. The LNA 20 preferably includes a compensation circuit that actively compensates selected bias levels within the LNA 20 in response to variations in the power supply voltage, as more fully described in co-pending U.S. patent application Ser. No. 09/311,234, entitled "Compensation Mechanism For Compensating Bias Levels Of An Operation Circuit In Response To Supply Voltage Changes". LNA 20 differentially drives a quadrature mixer pair 22 and 24.

The PLL synthesizer/(VCO) 12 provides local oscillator (LO) signals in phase quadrature to mixers 22 and 24 via interfaces 16 and 18, respectively. Mixer 22 mixes the non-phase shifted LO signal with the input signal, while Mixer 24 mixes the 90 degree phase shifted LO signal with the same input signal. In accordance with the present invention, mixers 22 and 24 also preferably include a compensation circuit that actively compensates selected bias levels in response to variations in power supply voltage, as more fully described in co-pending U.S. patent application Ser. No. 09/311,234, entitled "Compensation Mechanism For Compensating Bias Levels Of An Operation Circuit In Response To Supply Voltage Changes".

The differential outputs of mixer 22 and mixer 24 are provided to two identical signal channels in quadrature phase: the I-channel 40 and the Q-channel 42. I-channel 40 includes baseband filter block 26, and Q-channel 42 includes baseband filter block 28. Each baseband filter block includes a single pole low pass filter, followed by a second order filter (with two near-DC high-pass poles and two wideband low-pass poles), and a gyrator filter. The main channel filter of each baseband filter block is the gyrator filter, which preferably includes a gyrator-capacitor implementation of a 7-pole elliptic low-pass filter. A preferred 7-pole elliptic low-pass filter is described in U.S. patent application Ser. No. 09/311,105, entitled "Differential Filter With Gyrator". The elliptic filter minimizes the total capacitance required for a given selectivity and dynamic range. In a preferred embodiment, the low-pass gyrator cut-off frequency can be adjusted by an external resistor.

I-channel 40 and Q-channel 42 may also include limiter blocks 30 and 32, respectively. Limiter blocks 30 and 32 limit the amplitude, and thus remove the amplitude information, from the corresponding signals. The resulting signals are then provided to the demodulator 50. At least one of the limiter blocks 30 and 32 may contain an RSSI (Receive Signal Strength Indicator) output that can be used for Forward-and-Reverse link power management for DSSS applications or for demodulating ASK (Amplitude Shift Key) or OOK (On Off Key) signals. One such power management approach is described in U.S. patent application Ser. No. 09/311,250, entitled "Wireless System With Variable Learned-In Transmit Power". The RSSI signal may also be used by AFC (Automatic Frequency Control frequency tracking) or AGC (Automatic Gain Control dynamic range enhancement), or both.

The demodulator 50 combines and demodulates the I- and Q-channel outputs to produce a digital data output 52. In doing so, the demodulator 50 detects the relative phase difference between the I- and Q-channel signals. If the I-channel signal leads the Q-channel signal, the FSK tone frequency lies above the tone frequency, indicating a data '1' state. If the I-channel signal lags the Q-channel signal, the FSK tone frequency lies below the tone frequency, indicating a data '0' state. The digitized output 52 of the receiver is provided to Control block 54 via CMOS-level converter 56 and CMOS Output Serial Data block 58.

The transmitter of the Narrowband FSK Transceiver 10 includes a PLL frequency synthesizer and a power amplifier 60. It is the power amplifier 60 that is the subject of the present application, as more fully described below with reference to FIGS. 2A–4B. The frequency synthesizer may include a voltage-controlled oscillator (VCO) 12, a crystal oscillator, a prescaler, a number of programmable frequency dividers, and a phase detector. A loop filter may also be provided external to the chip for flexibility, which may be a simple passive circuit. The VCO 12 preferably provides one or more on-chip varactors. In one embodiment, the VCO 12 includes a high tune sensitivity varactor for wideband modulation and a low tune sensitivity varactor for narrowband modulation. The modulation varactor that is chosen depends on the particular application. The modulation varactors are used to modulate a serial data stream onto a selected carrier frequency. The modulated signal is provided to the power amplifier 60, which drives the external antenna 14.

Preferably, the output power level of the power amplifier 60 is controlled by Control block 54 via interface 55. This allows transmitting Narrowband FSK Transceiver 10 to transmit a signal at a relatively low power level to conserve system power. If an acknowledge is received from a receiving Narrowband FSK Transceiver, the transmission is complete. If an acknowledge is not received, however, the transmitting Narrowband FSK Transceiver 10 may increase the power level of the power amplifier 60. If an acknowledge is still not received from a receiving Narrowband FSK Transceiver, the transmitting Narrowband FSK Transceiver 10 may again increase the power level of the power amplifier 60. This may be repeated until an acknowledge is received, or the maximum power level of the power amplifier 60 is reached. A further discussion of this and other power management algorithms are described in co-pending U.S. patent application Ser. No. 09/311,250, entitled "Wireless System With Variable Learned-In Transmit Power".

A four-pin Serial Peripheral Interface (SPI) bus 62 is used to program the internal configuration registers of the control block 54, and access the transmit (Tx) FIFO 64 and the receive (Rx) FIFO 66. During a transmit operation, data bytes are written to the Tx FIFO 64 over the SPI bus 62. The controller block 54 reads the data from the Tx FIFO 64, and shifts the data serially with the addition of Start and Stop bits to VCO 12 for modulation. As indicated above, VCO 12 then provides the modulated signal to power amplifier 60, which drives the external antenna 14.

During a receive operation, the received signal is provided to LNA 20, down I-channel 40 and Q-channel 42 as described above, and finally to demodulator 50. The demodulated signal is then over-sampled to detect the Start and Stop bits for synchronization. After a complete byte is serially collected, including the corresponding Start and Stop bits, the byte is transferred to the Rx FIFO 66. The Controller block 54 senses when the Rx FIFO 66 has data, and sends an SPI interrupt signal on SPI bus 62, indicating that the Rx FIFO 66 is ready to be read by an external processor or the like (not shown).

Figure 2A:
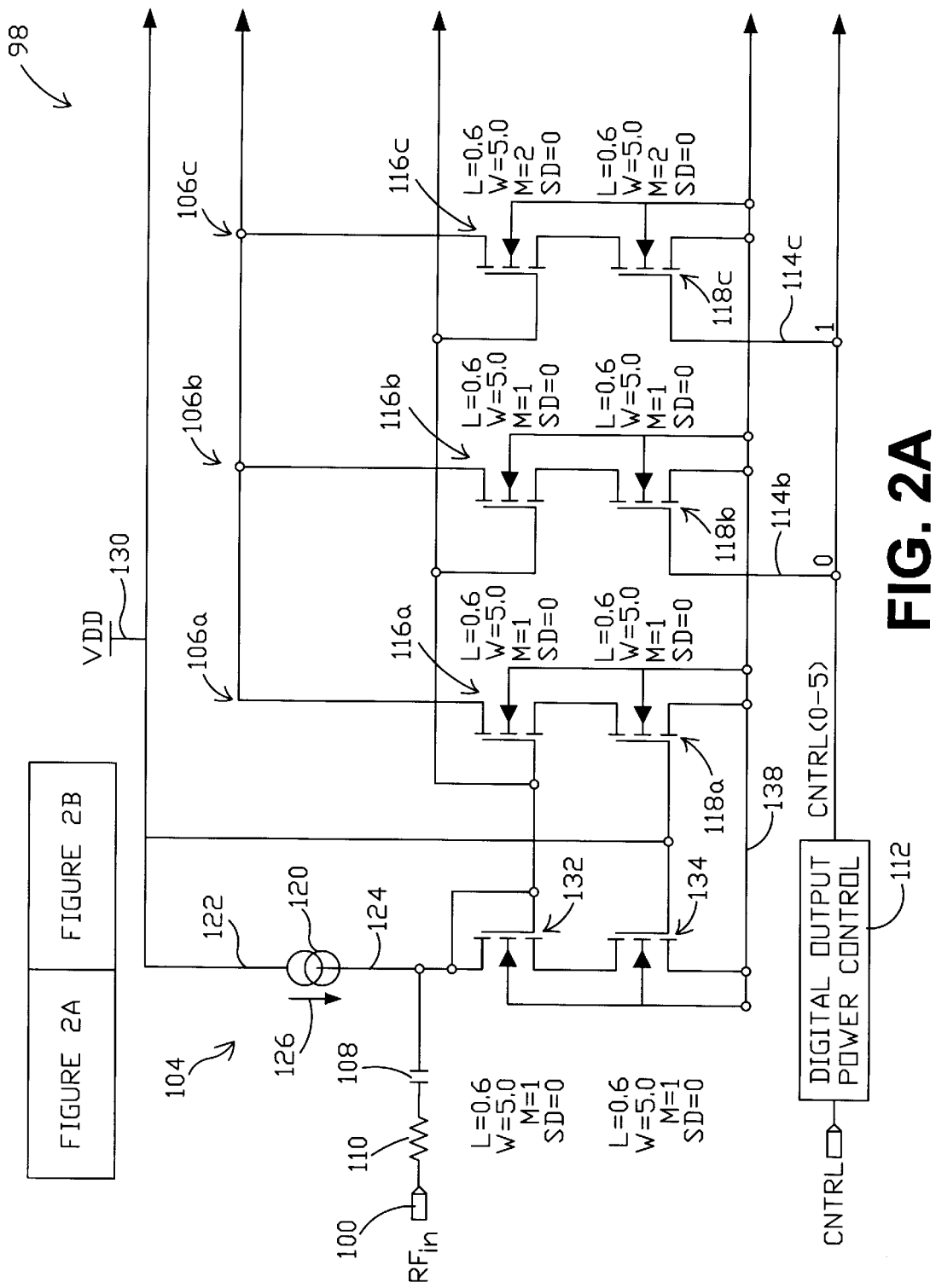
FIGS. 2A–2B show a schematic diagram of a first illustrative output buffer of the present invention.
Figure 2B:
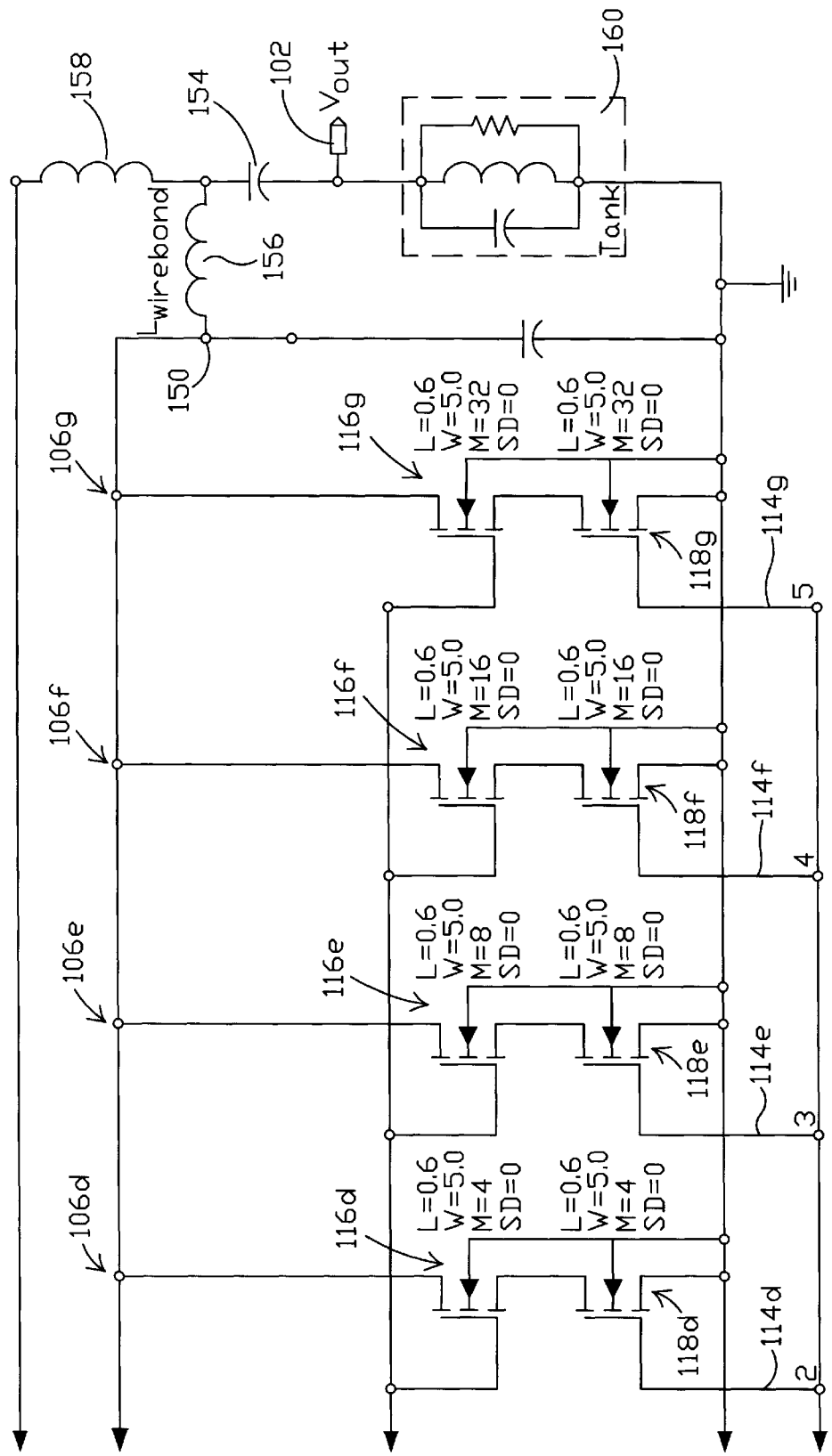

FIGS. 2A–2B show a schematic diagram of a first illustrative output buffer of the present invention. The illustrative output buffer is generally shown at 98, and includes a data input terminal 100 and a data output terminal 102 (see FIG. 2B). The output buffer 98 receives a data input signal on the data input terminal 100, and provides a data output signal on the data output terminal 102. The output buffer includes a current mirror that has a reference leg 104 and a number of current mirror legs 106a–106g. The reference leg 104 is coupled to the data input terminal 100 via a coupling capacitor 108 and a resistor 110. Each of the current mirror legs 106a–106g are preferably coupled to the data output terminal 102 via a coupling capacitor 154.

The reference leg 104 is biased using a current source 120 that has a first terminal 122 and a second terminal 124. The current source 120 preferably provides a reference current 126 that is relatively independent of the variations in the supply voltage 130. The first terminal 122 of the current source 120 is coupled to the supply voltage. A first transistor 132 and a second transistor 134 are also provided. The drain of a first transistor is coupled to: (1) the second terminal 124 of the current source 120; (2) the data input terminal 100 of the output buffer through a coupling capacitor 108 and a resistor 110; and (3) the gate of the first transistor 132. The drain of the second transistor 134 is coupled to the source of the first transistor 132. The source of the second transistor 134 is coupled to ground 138. Finally, the gate of the second transistor 134 is coupled to the supply voltage 130, as shown.

Likewise, each of the current mirror legs 106a–106g preferably includes a current mirror transistor 116a–116g and an enable transistor 118a–118g, respectively. In the embodiment shown, the drain of each of the current mirror transistors 116a–116g is coupled to the data output terminal 102 of the output buffer via coupling capacitor 154. The gate of each of the current mirror transistors 116a–116g is coupled to the gate of the first transistor 132 of the reference leg 104.

The drain of each of the enable transistors 118a–118g is coupled to the source of a corresponding current mirror transistor 116a–116g. The source of each of the enable transistors 118a–118g is coupled to ground 138. Finally, the gate of each of the enable transistors 118a–118g is coupled to a corresponding one of the enable terminals 114b–114g.

For some current mirror legs, the enable terminal may be coupled to the supply voltage. For other current mirror legs, the enable terminal may be controlled by the controller 112.

In use, the data input signal provides an input reference current to the reference leg 104. Each of the current mirror legs 106a–106g provide an output current to the data output terminal 102 that is proportional to the input reference current in the reference leg 104.

To provide a programmable output power level, the controller 112 may enable a first set of the current mirror legs 106a–106g to provide a first output current to the data output signal, and subsequently enable a second set of current mirror legs 106a–106g to provide a second output current to the data output signal. Preferably, the controller 112 digitally controls the enable terminals 114b–114g of the selected current mirror legs 106b–106g to control which of the current mirror legs are enabled.

To provide a broad spectrum of output power levels, some of the current mirror legs 106a–106g may draw a different output current than other current mirror legs. In the embodiment shown, current mirror legs 106a–106b each draw a similar output current from the data output terminal 102. This is accomplished by making the current mirror transistors 116a and 116b approximately the same size, and the enable transistors 118a and 118b approximately the same size. Current mirror leg 106c preferably draws about twice the output current as current mirror legs 106a–106b. This is accomplished by making the current mirror transistor 116c twice the size of current mirror transistors 116a and 116b, and the enable transistor 118c about twice the size of enable transistors 118a and 118b. Finally, current mirror leg 106d preferably draws about twice the output current as current mirror leg 106c; current mirror leg 106e draws about twice the output current as current mirror leg 106d; current mirror leg 106f draws about twice the output current as current mirror leg 106e; and current mirror leg 106g draws about twice the output current as current mirror leg 106f.

An illustrative method of the present invention includes the steps of: (1) receiving a data input signal; (2) converting the data input signal to an input reference current; (3) mirroring the input reference current to two or more current mirror legs, wherein each of the current mirror legs provides an output current to the data output signal that is proportional to the input reference current; (4) enabling a first set of the current mirror legs to achieve a first output power level in the data output signal; and (5) enabling a second set of the current mirror legs to achieve a second output power level in the data output signal, wherein the first output power level is different from the second output power level.

In the embodiment shown, the current mirror transistors 116a–116g are not directly connected to the data output terminal 102. Rather, the current mirror transistors 116a–116g are connected to an internal output pin 150. The internal output pin 150 is AC coupled to the data output terminal 102 via capacitor 154. Parasitic inductor 156 is also shown. Inductor 158 is an externally provided RF choke that is used to provide DC bias currents to the mirrored output stages while blocking the RF signal output from the VDD supply.

The data output terminal 102 is also shown coupled to tank 160. Tank 160 provides harmonic filtration to the data output signal, and also boosts the peak amplitude of the data output signal. Tank 150 includes a parallel LRC network. One advantage of using a parallel LC or LRC resonant tank 160 is that the tank can be tuned to allow a band of frequencies to pass therethrough, while attenuating spurious emissions. Another advantage of using a parallel LC or LRC resonant tank 160, in conjunction with an RF choke, is that the peak amplitude of the output signal can be increased to about twice the supply voltage 130. This helps increase the voltage of the RF signal at the antenna 14. It is recognized that the parallel LRC tank configuration is only illustrative, and that other tank configurations may provide similar characteristics.

Because the tank 160 increases the peak voltage amplitude of the output signal to about twice the supply voltage 130, the current mirror transistors 116a–116g of the embodiment of FIGS. 2A–2B must be configured to handling the increased voltage. This can be accomplished by using a lower supply voltage, which reduces the peak amplitude of the output signal. Alternatively, or in addition to, the current mirror transistors 116a–116g may be fabricated to tolerate the increased voltage. The enable transistors 118a–118g may or may not be similarly fabricated.

For many applications, minimizing the power consumption of a device is paramount. One such application is when a battery or the like is used as the power supply. To help reduce the power, the supply voltage can be reduced from, for example, 5.0V to 3.0V. While this helps reduce the power consumed by the device, it also tends to reduce the performance of the device. To help regain some of the performance, a low voltage manufacturing process may be used to fabricate a low voltage device. For example, in a 3.0V low voltage process, the gate oxide may be made thinner than in a conventional 5.0V process. This tends to increase the speed and sensitivity of the active devices. Other process parameters may be similarly changed for increased performance of the device.

A limitation of using a low voltage process is that the resulting devices may be more sensitive to voltage, and may become damaged when exposed to higher voltages. For some low voltage devices, the application of only five volts can cause damage to the device by, for example, breaking down the gate oxide and thus rendering the device inoperative. This increase in voltage swing may damage the gate oxide or other layer or layers in the low voltage device.

Figure 3A:
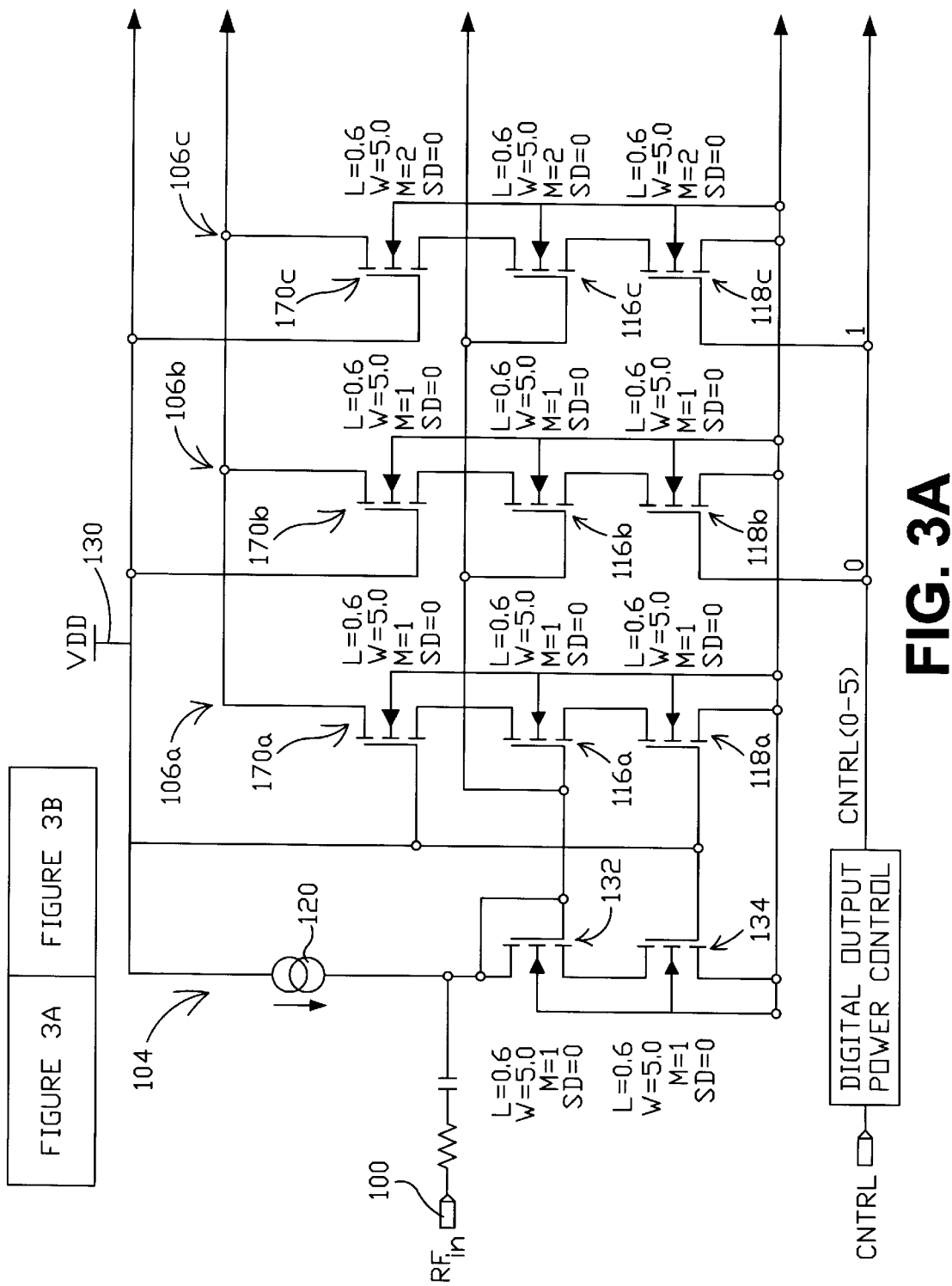
FIGS. 3A–3B show a schematic diagram of a second illustrative output buffer of the present invention including a number of cascode over-voltage protection devices.
Figure 3B:
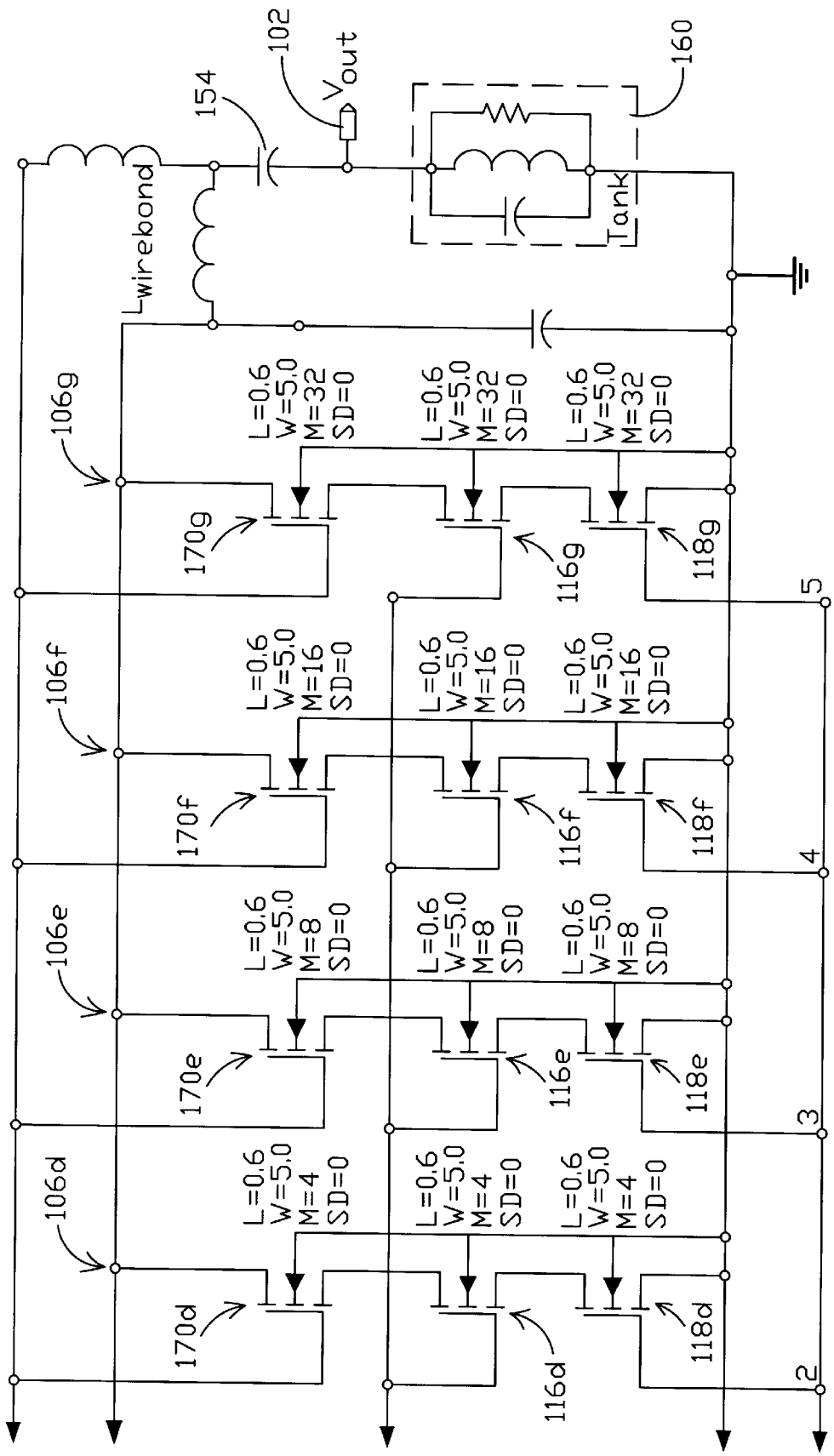

FIGS. 3A–3B show a schematic diagram of a second illustrative output buffer of the present invention including a number of cascode over-voltage protection devices. As indicated above, for some applications, it may be desirable to increase the voltage level that the output terminal of an output buffer can tolerate. This may be particularly useful when a tank or the like is used in conjunction with an output buffer that is fabricated using a low voltage process. As indicated above, the tank can cause the output voltage to swing at twice the supply voltage.

To increase the voltage level that the output terminal of the output buffer can tolerate, it is contemplated that a number of cascode transistors 170a–170g may be inserted between each of the current mirror legs 116a–116g and the output terminal 102. In the illustrative embodiment, the source of each of the cascode transistors 170a–170g is coupled to the drain of the corresponding current mirror transistor 116a–116g. The drain of each of the cascode transistors 170a–170g is coupled to the data output terminal 102 through coupling capacitor 154. Finally, the gate of each of the cascode transistors 170a–170g is coupled to the supply voltage 130.

Each cascode transistor 170a–170g may have a thicker gate oxide than the current mirror transistors 116a–116g and the enable transistors 118a–118g. Preferably, a dual oxide process is used to form the cascode transistors 170a–170g. Other fabrication steps or techniques may also be used to further increase the voltage that the cascode transistors 170a–170g can tolerate. The current mirror transistors 116a–116g and the enable transistors 118a–118g may thus be fabricated using a low voltage process for increased performance.

Figure 4A:
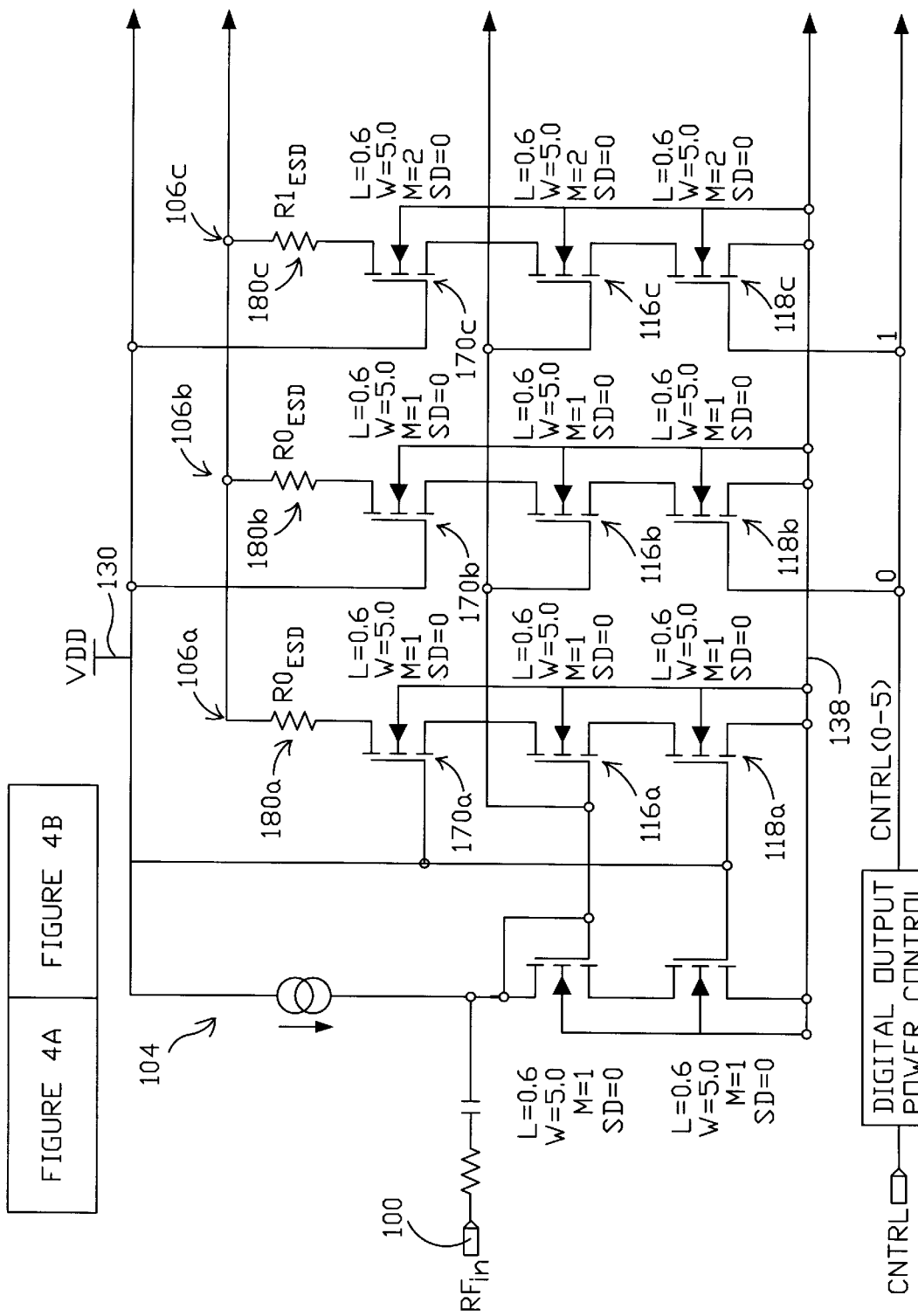
FIGS. 4A–4B show a schematic diagram of a third illustrative output buffer of the present invention including a number of cascode over-voltage protection devices and a number of ESD resistors.
Figure 4B:
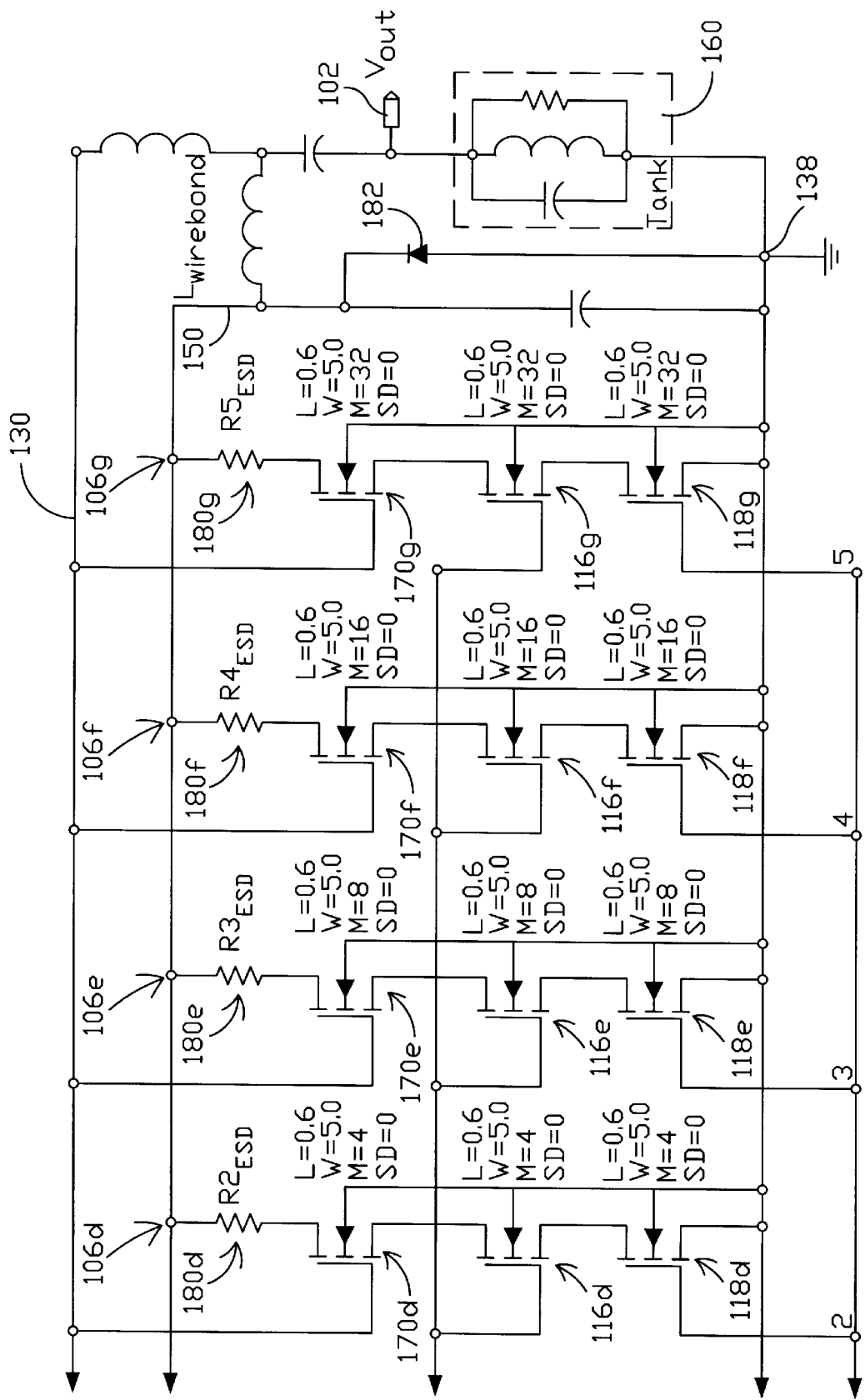

To help protect the current mirror legs from large voltage spikes, such as those experienced during an ESD event, a number of resistors 180a–180g may be provided. Each of the resistors 180a–180g may be provided between the drain terminal of each of the current mirror transistors 116a–116g (or the drain terminal of the cascode transistors 170a–170g, if present) and the data output terminal 102. FIGS. 4A–4B show a schematic diagram of a third illustrative output buffer of the present invention, including a number of ESD resistors inserted between the cascode over-voltage protection devices of FIGS. 3A–3B and the data output terminal 102.

Each of the resistors 180a–180g reduces the current that can pass through the corresponding current mirror leg 106a–106g during an ESD event, while minimize the overall resistance in the output path. This improves the ESD protection level of the output buffer. Because the resistors 180a–180g are placed in each parallel current mirror leg 106a–106g, the effective resistance to the data output terminal 102 is minimized, which helps maintain an acceptable performance level of the buffer.

Preferably, each resistor 180a–180g is sized so that the resistance of the resistor times the output current of the corresponding current mirror leg 106a–106g equals a constant value across all current mirror legs 106a–106g. For example, as indicated above, current mirror legs 106a–106g each draw a different output current from the data output terminal 102.

Current mirror legs 106a and 106b each draw similar output current. Current mirror leg 106c draws about twice the output current of current mirror legs 106a–106b. Current mirror leg 106d preferably draws about twice the output current as current mirror leg 106c. Current mirror leg 106e draws about twice the output current as current mirror leg 106d. Current mirror leg 106f draws about twice the output current as current mirror leg 106e. Finally, current mirror leg 106g draws about twice the output current as current mirror leg 106f.

Accordingly, resistors 180a and 180b preferably have the same resistance. Resistor 180c preferably has about one-half the resistance of resistors 180a and 180b. Resistor 180d preferably has about one-half the resistance of resistors 180c. Resistor 180e preferably has about one-half the resistance of resistors 180d. Resistor 180f preferably has about one-half the resistance of resistors 180e. Finally, resistor 180g preferably has about one-half the resistance of resistors 180f. Resistors 180a–180g are preferably polysilicon resistors having resistance values of 200 ohms, 200 ohms, 100 ohms, 50 ohms, 25 ohms, 12.5 ohms, and 6.5 ohms, respectively.

Finally, an ESD diode 182 having an anode and a cathode may be provided between the data output terminal 102 (or the internal output pin 150) and ground 138. The anode is coupled to ground 138 and the cathode is coupled to the data output terminal 102 (or the internal data output pin 150). In this configuration, diode 182 helps limit the negative voltage spikes on the data output terminal 102 (or the internal output pin 150.)

In the embodiment shown, a similar diode is not provided between the data output terminal 102 and the supply voltage 130. Such a diode would tend to clamp the data output terminal 102 about one diode drop above the supply voltage 130. However, and as indicated above, it is often desirable to have the data output signal peak at about twice the supply voltage 130. This would not be possible with a diode connected between the data output terminal 102 and the supply voltage 130.

Having thus described the preferred embodiments of the present invention, those of skill in the art will readily appreciate that the teachings found herein may be applied to yet other embodiments within the scope of the claims hereto attached.

What is claimed is:

1. A buffer having a data input terminal and a data output terminal, the buffer receiving a data input signal on the data input terminal, and providing a data output signal on the data output terminal, the buffer comprising:

current mirror means having a reference leg and two or more current mirror legs, selected current mirror legs having an enable terminal, the reference leg being coupled to the data input terminal of the buffer, and the two or more current mirror legs being coupled to the data output terminal of the buffer;

the data input signal providing an input reference current to the reference leg;

each of the current mirror legs providing an output current in the same direction as the other current mirror legs to the data output terminal with a magnitude that is proportional to the input reference current; and control means coupled to the enable terminals of selected current mirror legs for enabling a first set of the current mirror legs to provide a desired output current to the data output terminal.

2. A buffer according to claim 1, wherein the control means digitally controls the enable terminals of the selected current mirror legs to control which of the current mirror legs are enabled.

3. A buffer according to claim 1, wherein each of two of the current mirror legs draw a different output current from the data output terminal.

4. A buffer according to claim 1, wherein a first current mirror leg and a second current mirror leg each draw a first output current from the data output terminal.

5. A buffer according to claim 4, wherein a third current mirror leg draws a second output current from the data output terminal, wherein the second output current is twice that of the first output current.

6. A buffer according to claim 5, wherein a fourth current mirror leg draws a third output current from the data output terminal, wherein the third output current is twice that of the second output current.

7. A buffer according to claim 2, wherein the reference leg comprises:

a current source having a first terminal and a second terminal, the first terminal being coupled to a supply voltage;

a first transistor having a gate, a source and a drain, the drain of the first transistor is coupled to the second terminal of the current source, to the data input terminal of the buffer through a coupling capacitor, and to the gate of the first transistor; and a second transistor having a gate, a source and a drain, wherein the drain of the second transistor is coupled to the source of the first transistor, the source of the second transistor is coupled to ground, and the gate of the second transistor is coupled to the supply voltage.

8. A buffer according to claim 7, wherein each of the selected current mirror legs comprise:

a current mirror transistor having a gate, a source and a drain, wherein the drain of the current mirror transistor is coupled to the data output terminal of the buffer, and the gate of the current mirror transistor is coupled to the gate of the first transistor of the reference leg; and an enable transistor having a gate, a source and a drain, wherein the drain of the enable transistor is coupled to the source of the current mirror transistor, the source of the enable transistor is coupled to ground, and the gate of the enable transistor is coupled to an enable terminal.

9. A buffer according to claim 8, wherein the enable terminal is coupled to the supply voltage.

10. A buffer according to claim 8, wherein the enable terminal is controlled by the control means.

11. A buffer according to claim 8, wherein selected current mirror legs further include a resistor interposed between the drain terminal of the current mirror transistor and the data output terminal.

12. A buffer according to claim 7, wherein selected current mirror legs comprise:

a current mirror transistor having a gate, a source and a drain, wherein the gate of the current mirror transistor is coupled to the gate of the first transistor of the reference leg;

an enable transistor having a gate, a source and a drain, wherein the drain of the enable transistor is coupled to the source of the current mirror transistor, the source of the enable transistor is coupled to ground, and the gate of the current mirror transistor is coupled to an enable terminal; and a cascode transistor having a gate, a source and a drain, wherein the source of the cascode transistor is coupled to the drain of the current mirror transistor, the drain of the cascode transistor is coupled to the data output terminal, and the gate of the cascode transistor is coupled to the supply voltage.

13. A buffer according to claim 12, wherein selected current mirror legs further include a resistor interposed between the drain terminal of the cascode transistor and the data output terminal.

14. A buffer according to claim 13, wherein the resistor in each of the selected current mirror legs is sized so that the resistance of the resistor times the output current of the corresponding current mirror leg equals a constant value across each of the selected current mirror legs.

15. A buffer according to claim 13, further comprising an ESD diode having an anode and a cathode, wherein the anode is coupled to ground and the cathode is coupled to the data output terminal.

16. A buffer according to claim 13, further comprising a tank coupled to the data output terminal, the tank providing harmonic filtration to the data output signal.

17. A buffer according to claim 16, wherein the tank causes the data output signal to rise above the supply voltage at a selected operating frequency.

18. A buffer according to claim 17, wherein the tank causes the data output signal to peak at about two times the supply voltage at the selected operating frequency.

19. A buffer according to claim 17, wherein the cascode transistor is provided between each current mirror transistor and the data output terminal to absorb at least part of the voltage rise above the supply voltage.

20. A buffer according to claim 17, wherein the enable transistor and the current mirror transistor have a gate oxide of a first thickness, and the cascode transistor has a gate oxide of a second thickness, wherein the second thickness is greater than the first thickness.

21. A buffer according to claim 20, wherein the second thickness is about twice as thick as the first thickness.

22. A buffer according to claim 21, wherein the cascode transistor is formed using a dual oxide process and the control transistor and the current mirror transistor are formed using a standard single oxide process.

23. A buffer having an output terminal and powered by a supply voltage, the output terminal of the buffer coupled to a load, wherein the load causes the voltage at the output terminal to exceeding the supply voltage at a selected frequency, the buffer comprising:

drive means for providing a drive current to the output terminal of the buffer, and ultimately to the load; and a cascode transistor positioned between the drive means and the output terminal for absorbing at least part of the voltage rise of the output terminal above the supply voltage.

24. A buffer according to claim 23, wherein the cascode transistor includes a dual oxide layer while the drive means is formed using a standard single oxide layer.

25. A buffer according to claim 23, wherein the drive means comprises an N-channel FET transistor.

26. A buffer according to claim 23, wherein the drive means comprises a current mirror leg from a current mirror circuit.

27. A buffer according to claim 23, wherein the drive means comprises two stacked N-channel transistors.

28. A method for buffering a data input signal and for providing a data output signal, comprising:

receiving the data input signal;

converting the data input signal to an input reference current;

mirroring the input reference current to two or more current mirror legs, wherein each of the current mirror legs provides an output current in the same direction as the other current mirror legs to the data output signal with a magnitude that is proportional to the input reference current; and enabling a first set of the current mirror legs to achieve a first output power level in the data output signal.

29. A method according to claim 28, further comprising the step of:

enabling a second set of the current mirror legs to achieve a second output power level in the data output signal, wherein the first output power level is different from the second output power level.

* * * * *